(12) United States Patent
Aslam et al.

(10) Patent No.: US 7,341,932 B2
(45) Date of Patent: Mar. 11, 2008

(54) SCHOTTKY BARRIER DIODE AND METHOD THEREOF

(75) Inventors: Shahid Aslam, Washington, DC (US); David Franz, Pasadena, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 285 days.

(21) Appl. No.: 11/251,531

(22) Filed: Sep. 30, 2005

(65) Prior Publication Data

US 2007/0075391 A1    Apr. 5, 2007

(51) Int. Cl.
*H01L 21/28* (2006.01)

(52) U.S. Cl. ............... 438/570; 257/E21.351

(58) Field of Classification Search ......... 438/570; 257/E21.351
See application file for complete search history.

(56) References Cited

U.S. PATENT DOCUMENTS

| | | | |
|---|---|---|---|
| 6,057,565 A | 5/2000 | Yoshida et al. | |
| 6,420,736 B1 | 7/2002 | Chen et al. | |
| 2004/0080010 A1 | 4/2004 | Parikh et al. | |
| 2005/0001235 A1 | 1/2005 | Murata et al. | |
| 2005/0062048 A1 | 3/2005 | Hayashi et al. | |

OTHER PUBLICATIONS

Shahid Aslam et al., "Large Area Pt/n-GaN Schottky barrier diode with extremely low leakage current", EDL Manuscript No. 1698, May 20, 2003, pp. 1-3, USA.

*Primary Examiner*—Scott B. Geyer
*Assistant Examiner*—Elias Ullah

(57) ABSTRACT

Pt/n⁻GaN Schottky barrier diodes are disclosed that are particularly suited to serve as ultra-violet sensors operating at wavelengths below 200 nm. The Pt/n⁻GaN Schottky barrier diodes have very large active areas, up to 1 cm², which exhibit extremely low leakage current at low reverse biases. Very large area Pt/n⁻GaN Schottky diodes of sizes 0.25 cm² and 1 cm² have been fabricated from n⁻/n⁺ GaN epitaxial layers grown by vapor phase epitaxy on single crystal c-plane sapphire, which showed leakage currents of 14 pA and 2.7 nA, respectively for the 0.25 cm² and 1 cm² diodes both configured at a 0.5V reverse bias.

18 Claims, 7 Drawing Sheets

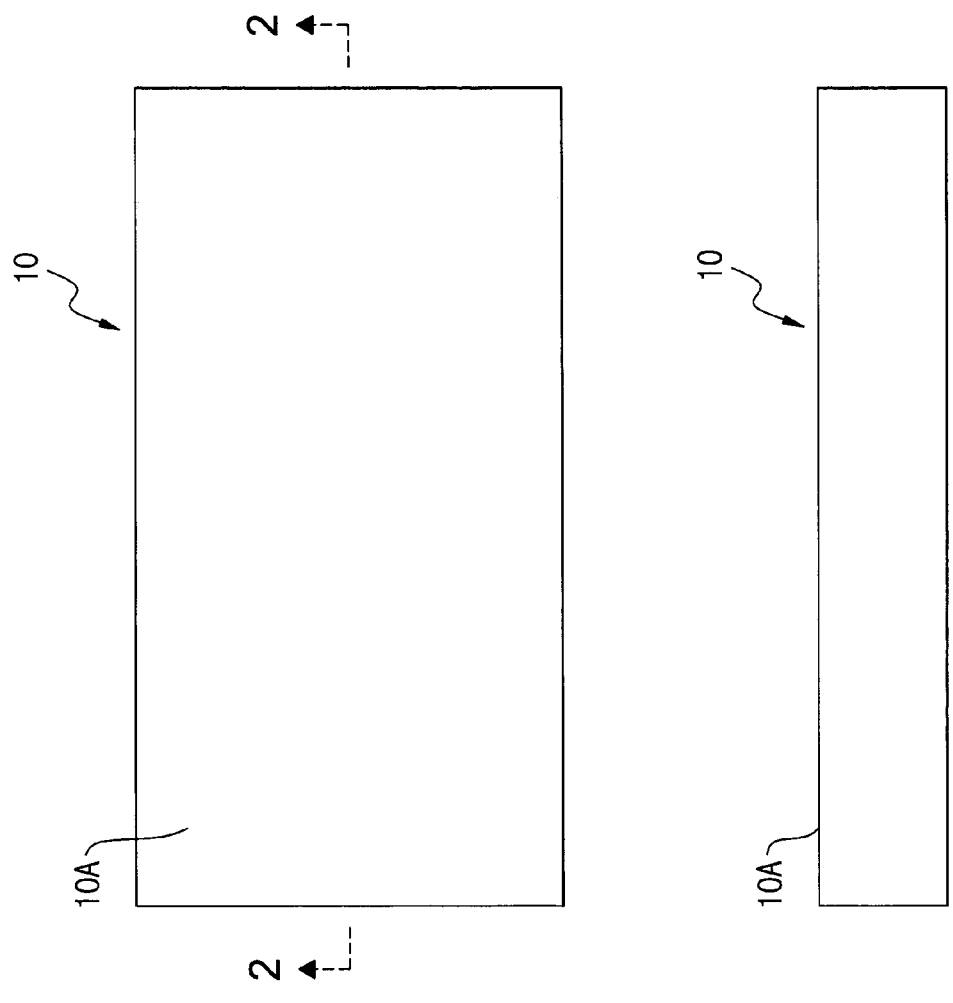

SCHOTTKY BARRIER DIODE AND METHOD THEREOF

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457), and may be manufactured and used by or for the Government for governmental purposes without the payment of any royalties thereon or therefor.

BACKGROUND OF THE INVENTION

1. Field of the Invention

The invention relates generally to a device and method for a sensor. More particularly, the present invention relates to a method for producing a Schottky barrier diode that is particularly suited to serve as an ultra-violet sensor.

2. Background Description

Spacecraft and other vehicles, such as satellites, need to successfully operate in the presence of a wide range of radiation wavelengths sometimes at extreme ultraviolet (EUV) wavelengths. For example, the Sun has a spectrum that is dominated by a few bright emission lines. The intensity of the solar EUV flux is highly variable, often changing by a factor of two in a period of one hour and by an order of magnitude from solar minimum to solar maximum. Absorption of this variable solar EUV radiation by the Earth's upper atmosphere can disrupt RF communications, causes errors in GPS navigation, and increases the drag on satellites in low-Earth orbits. To aid in characterizing these effects, it is advantageous to have an Extreme Ultra Violet Sensor (EUVS) that will measure the total solar flux in a number of EUV spectral bands.

Present devices serving as EUVS consist of single large-area (about 1 $cm^2$) silicon photo-diode detectors and may be employed in an apparatus that senses radiation. Typical radiation sensing devices may have at least five channels, some of which operate in conjunction with telescopes. One channel may operate at the Lyman-a wavelength of 122 nm, one of the longest wavelengths serviced by the EUVS. This channel may have a spectral filter that comprises a thin metallic film deposited on a window and a single detector operating in the first order beam of a grating associated with the respective telescope.

Each photo-diode detector serving as an EUVS and operating in the five-channel apparatus has a Woodes filter consisting of a thin metallic film deposited directly on the front surface. In the EUV band, the threshold for detection (the spectral irradiance level at which the signal to noise ratio must exceed unity) is about 1-2 $mW/m^2$-nm. The total solar irradiance, integrated over all wavelengths, is about 1370 $W/m^2$. Of this total irradiance, about 1000 $W/m^2$ occurs in the wavelengths range from approximately 200-100 nm from the near UV to the band-gap of silicon. In order to maximize the transmission of the filter within the spectral band, present devices include a channel design with a thin film of metal such that the transmissivity is peaked within the spectral band. These devices are often not suitable for use with EUV due to problems with long-term instability and inadequate rejection of visible light. The formation of inter-metallic compounds probably contributed to both of these problems as the detector current, due to dark and long-wave radiation, greatly exceeds the "signal" current produced by in-band EUV radiation.

Further, the signal-to-noise ratios (SNRs) of the signal current do not satisfy the EUVS requirements and, therefore, improved EUVS need to be provided. Enhanced requirements place greater demands upon the system to reduce detector dark current and current generated by visible radiation.

Thus, there is a need for an improved EUVS that can isolate small vacuum ultraviolet signals from the large, variable visible-near-infra-red signal background. The improved EUVS should take into account the fact that the primary source of out-of-band photo-current is radiation for which the photon energy exceeds the band-gap of the typical detector, since only these photons are capable of producing photo-current in the typical detector. For example, for silicon photo-detectors, this spectral region includes all wavelengths shorter than the silicon cut-off wavelength of approximately 1100 nm. The typical design goal for the filters is a transmissivity of 0.1-0.3 in the EUV band and <10-5 in the "visible" band from 200-1100 nm. The EUV radiation that is diffracted by the transmission grating onto the detector contains not only the first diffraction order, but also its harmonics. Therefore, it is critical for the filters to have low transmission values at these harmonic wavelengths.

SUMMARY OF THE INVENTION

The present invention is directed to a method and a Schottky barrier diode produced therefrom that is particularly suited to serve as an ultra-violet sensor.

Accordingly, it is desired that the present invention provide an EUVS that is capable of rejecting the bulk of the solar spectrum at longer wavelengths, while at the same time successfully operating at wavelengths below about 200 nm.

It is further desired that the present invention provide an EUVS that meets the requirement of long-term stability.

In addition, it is desired that the present invention provide an EUVS having a relatively large surface area (up to about 1 $cm^2$) so as to capture the whole surface typically made available on a solar disc with simplicity of optics.

It is still further desired that the present invention provide an EUVS having low leakage current.

Furthermore, it is desired that the present invention provide an EUVS having substantial uniformity across the occupied spatial area.

In addition, it is desired that the present invention provide an EUVS that successfully operates between the wavelength range of about 5 nm to about 125 nm.

Still further, it is desired that the present invention provide an EUVS that detects EUV, while remaining so called "visibly blind," that is, provides no visible or near infra red (NIR) radiation contamination.

In the present invention, the desired signal is the photo-current produced by the in-band EUV solar radiance, wherein the in-band is the desired wavelength band for the detector. The undesired background current has two major components; the dark current and the photo-current produced by out-of-band radiation that reaches the photo-sensitive region of the detector. When a filter comprised of thin films of aluminum, as previously discussed, is used, the dark current is much larger than the photo-current and the effects of the dark current need to be taken into account.

Therefore, one embodiment of the present invention includes a method of forming a Schottky barrier diode comprising the steps of:

depositing a first layer of a predetermined thickness on a top surface of a wafer;

depositing a second layer on top of said first layer, said second layer serving as a buffer layer and having a predetermined thickness which is greater than said predetermined thickness of said first layer; depositing a third layer on top of said second layer, said third layer being composed of $n^+$ epilayer and having a predetermined thickness and a predetermined doping density; depositing a fourth layer on top of said third layer, said fourth layer being composed of a $n^-$ epilayer having a predetermined thickness, a predetermined doping density, and a top surface; cleaning said wafer having said first, second, third and fourth layers thereon; masking said top surface of said fourth layer to cover and protect at least one area; and, etching said top surface of said fourth layer so as to produce Schottky contact areas.

BRIEF DESCRIPTION OF THE DRAWINGS

FIG. 1 is a top view of one embodiment of a wafer associated with the present invention.

FIG. 2 is a cross sectional view of FIG. 1.

DETAILED DESCRIPTION

With reference to the drawings, wherein the same reference number indicates the same element throughout, there is shown in FIGS. 1 through 12 various steps associated with the method of the present invention. The method of the present invention produces Schottky diodes, preferably Pt/n⁻ Schottky barrier diodes, that are particularly suited to serve as ultra-violet sensors operating at wavelengths less than about 200 nm, and preferably within a range from about 5 nm to about 125 nm. The Pt/n⁻Schottky barrier diodes have relatively large surface areas up to about 1 cm² and exhibit extremely low leakage current at low reverse biases.

FIG. 1 shows a wafer 10, having a top surface 10A, and comprised of a single crystal material having a defined c-plane (0001), known in the art, in a top surface. For one embodiment, the single crystal wafer 10 may be composed of the single crystal material, such as sapphire, and wherein the c-plane is approximately 2 inches.

FIG. 2 shows a cross sectional view taken along line 2-2 of the wafer 10 show in FIG. 1. FIGS. 1 and 2 are both associated with step A of the method of one embodiment of the present invention.

Figure 3:
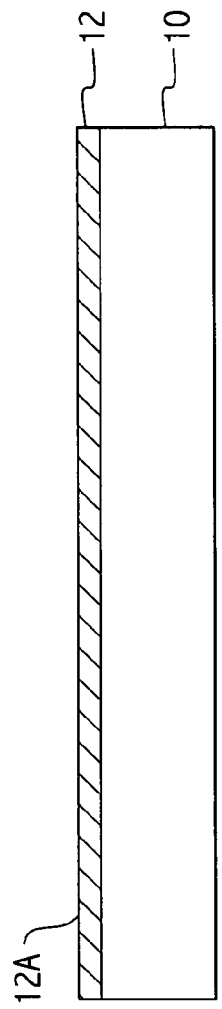
FIG. 3 is a cross-sectional view showing a first layer deposited on a wafer associated with the present invention.

FIG. 3 shows wafer 10 of FIG. 1 wherein a first layer 12 has been deposited onto the surface 10A of wafer 10. First layer 12 deposited on the top surface 10A of wafer 10 is preferably composed of GaN and has a predetermined range of thickness. The first layer 12 is preferably deposited by a nucleation process, which is known in the art. The thickness of first layer 12 preferably is constant throughout surface 10A. First layer has a preferred range of thickness from about 20 nm to about 35 nm.

Figure 4:
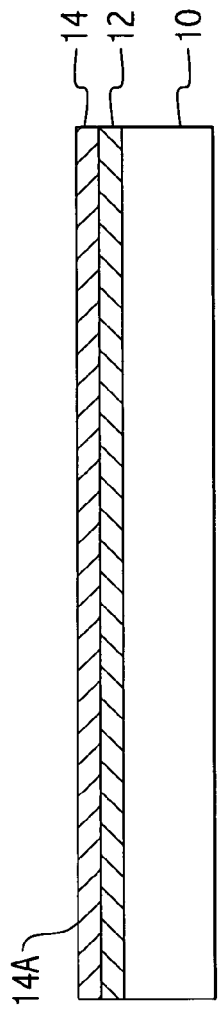
FIG. 4 is a cross-sectional view showing a second layer deposited onto a first layer of a wafer associated with the present invention.

FIG. 4 shows a cross-sectional view of wafer 10 wherein a second layer 14 is deposited on the top surface 12A of the first layer 12. Second layer 14 preferably is composed of GaN and serves as a buffer layer. The second layer 14 has a predetermined constant thickness that preferably is greater than the predetermined thickness of first layer 12. Second layer 14 is also preferably deposited by a nucleation process and has a preferred range of thickness from about 100 nm to about 150 nm. The deposition of the first and second layers 12 and 14 respectively, create a template for epitaxial growth.

Figure 5:
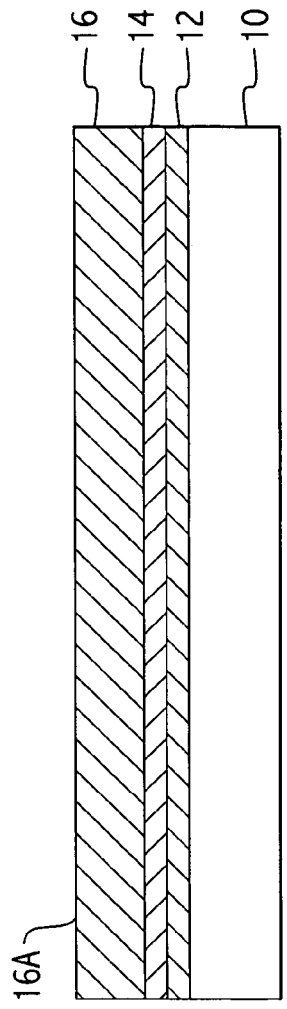
FIG. 5 is a cross-sectional view showing a third layer deposited onto a second layer of a wafer associated with the present invention.

FIG. 5 shows a cross-section of wafer 10 wherein a third layer 16 is deposited on surface 14A of layer 14. Third layer 16 on the top surface 14A of the second layer 14 preferably is composed of $n^+$ epilayer having a predetermined thickness and a predetermined doping density. The third layer 16 is preferably deposited by a vapor phase epitaxial process and has a preferred thickness of about 3 μm and a preferred range of thickness from about 2.5 μm to about 4.0 μm. The predetermined doping density for the third layer 16 is about $4.8 \times 10^{18}$ atoms/cm³.

Figure 6:
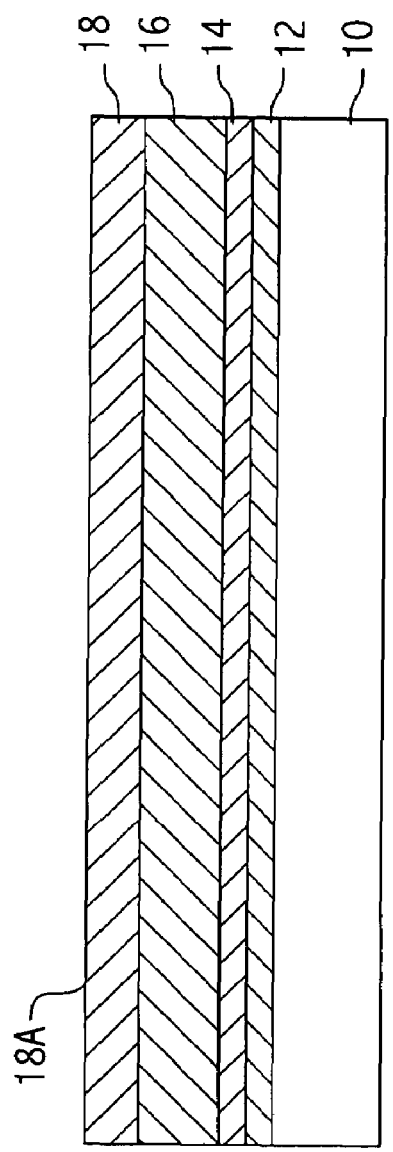
FIG. 6 is a cross-sectional view showing a fourth layer deposited onto a third layer of a wafer associated with the present invention.

FIG. 6 shows a cross-sectional view of wafer 10 wherein a fourth layer 18 is deposited on the top surface 16A of the third layer 16. Fourth layer 18 is composed of a $n^-$ epilayer having a predetermined thickness, a predetermined doping density, and a top surface. The fourth layer is preferably deposited by a vapor phase epitaxial process and has a preferred thickness of about 0.7 μm and a preferred range of thickness from about 0.3 μm to about 0.8 μm. A predetermined doping density used for the deposition of the fourth layer is preferably about $1.0 \times 10^{16}$ atoms/cm³.

Figure 7:
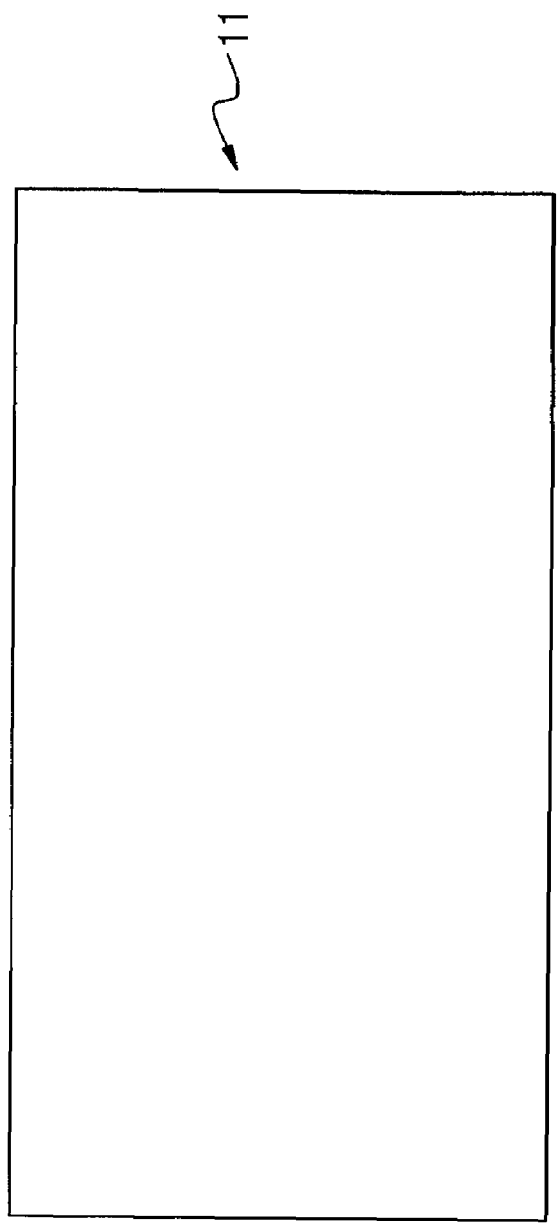
FIG. 7 is a top view of one embodiment of an intermediate device of the present invention.

FIG. 7 shows a top view of one embodiment of an intermediate device 11. Intermediate device 11 includes wafer 10 with the four layers 12, 14, 16 and 18 deposited thereon. A rigorous acid and organic solvent cleaning is applied to the device 11, before the occurrence of the masking process further described with reference to FIGS. 8 and 9.

Figure 8:
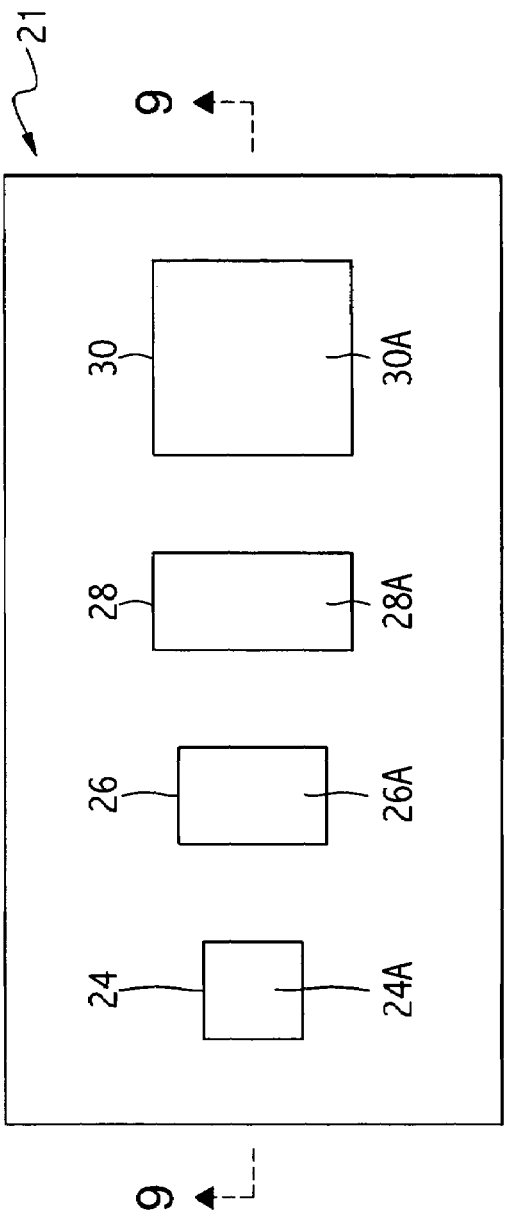
FIG. 8 is a top view of an intermediate device that includes mesas deposited thereon.

FIG. 8 shows a top view of another embodiment of an intermediate device 21. Intermediate device 21 represents one embodiment of the present invention, wherein four masks, not shown, were used to architecture a device that has four Schottky contact areas ranging in sizes up to about 1 cm². The four masks preferably provide mesas 24, 26, 28 and 30, each respectively having top surfaces 24A, 26A, 28A, and 30A.

Figure 9:
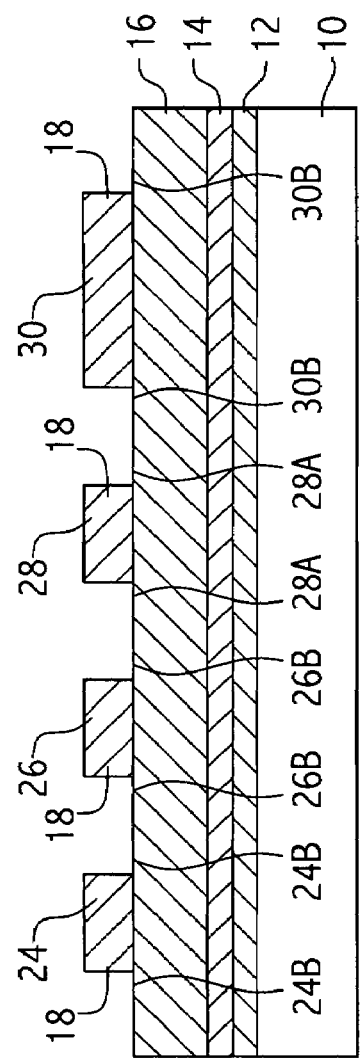
FIG. 9 is a cross sectional view of FIG. 8.

FIG. 9 shows a cross sectional view along lines 9-9 of FIG. 8. Mesas 24, 26, 28 and 30 also preferably include bottom portions 24B, 26B, 28B and 30B. The mesas 24, 26, 28, and 30 may first be defined using conventional photolithography as shown in FIG. 9 and then formed by chloride-bromine reactive ion etching for the selective removal of the n-epilayer 18.

Figure 10:
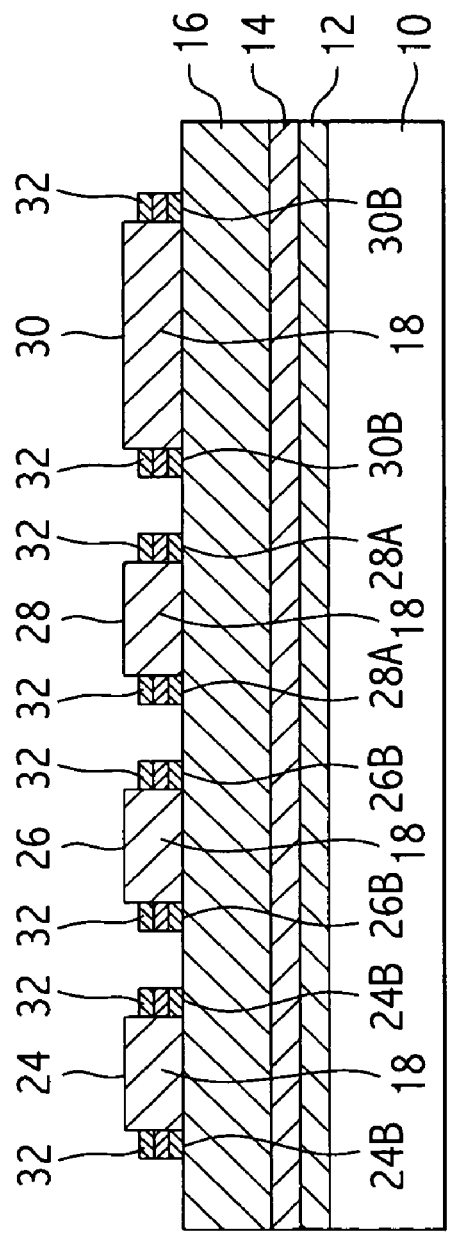
FIG. 10 is a cross-sectional view of FIG. 8 including metal layers deposited thereon.

FIG. 10 shows a cross-sectional view of yet another intermediate device 31 wherein first metal 32A, second metal 32B and third metal 32C are sequentially deposited on the bottom portion of each of the mesas, that is, 24B, 26B, 28B, and 30B, so as to form a fifth layer 32. Each of the first, second, and third metals preferably have a predetermined thickness. In one embodiment, the first, second, and third metals 32A, 32B, and 32C are placed on the bottom portions of the mesas, 24, 26, 28, and 30 by using a lift procedure, known in the art, and electronic beam evaporation, also known in the art. However, before the deposition of the first, second, and third metals 32A, 32B, and 32C is performed, the bottom portions 24B, 26B, 28B, and 30B are preferably treated with an oxygen plasma process for approximately 15 seconds. The first, second, and third metals comprising layers 32A, 32B, 32C, preferably are respectively comprised of Ti, Ni, and Al. First metal layer 32A and second metal layer 32B have a preferred thickness of about 10 nm-20 nm. Third metal layer 32C has a preferred thickness of about 100 mn-200 nm. Once metal layers 32A, 32B and 32C are deposited, device 31 preferably is annealed in flowing oxygen at a predetermined temperature for a predetermined period, so as to form an ohmic contact. The preferred predetermined temperature is about 500 ° C. and has a preferred range of temperatures of about 450 degrees C., to about 520 ° C. for approximately 10 minutes. The device now having the annealed fifth layer 32 preferably is subjected to the presence of atmospheric pressure of $N_2$ in a vacuum chamber for approximately one (1) hour.

Figure 11:
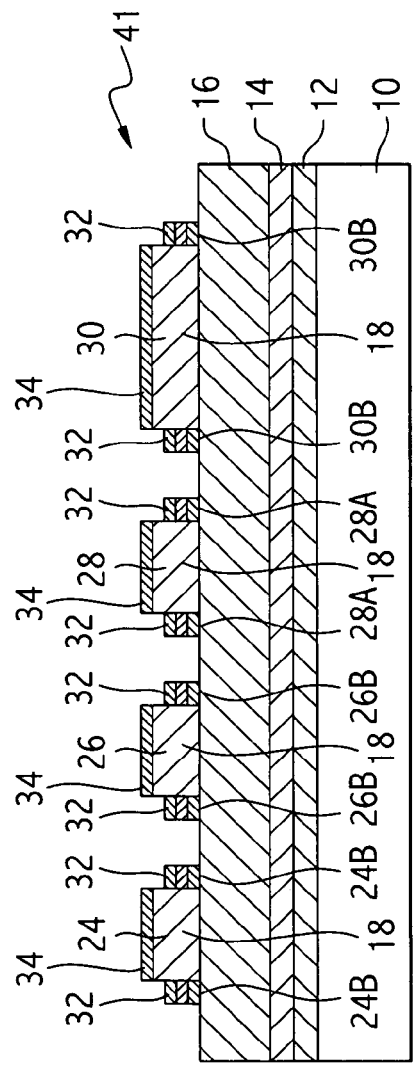
FIG. 11 is a cross-sectional view of another intermediate device of the present invention.

FIG. 11 shows a cross-sectional view of another embodiment of an intermediate device 41 wherein a sixth layer 34 is deposited on top of surfaces 24A, 26A, 28A, and 30A of mesas 24, 26, 28, and 30 respectively. Sixth layer 34 preferably has a predetermined thickness on each of the mesas surfaces 24A, 26A, 28A, and 30A. The sixth layer 34 preferably is composed of the semi-transparent material preferably formed of platinum (Pt) and has a preferred thickness of about 10 μm with a preferred range of thickness of about 5 nm to about 15 nm. The layer 34 is placed on the stop surfaces 24A, 26A, 28A, and 30A by a lift off procedure, known in the art. Sixth layer 34 preferably serves as a Pt Schottky contact.

Figure 12:
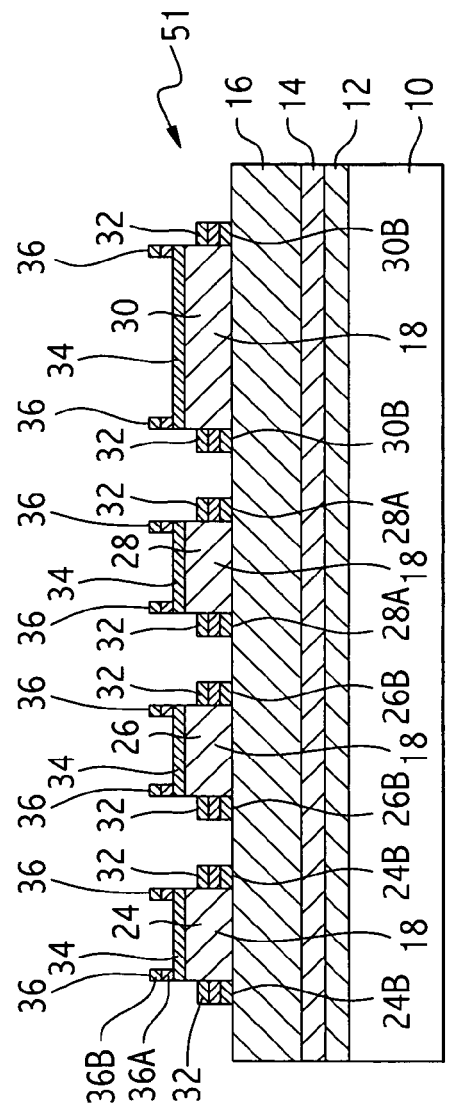
FIG. 12 is the cross sectional view of FIG. 11 including metal layers deposited thereon.

FIG. 12 shows device 51 wherein a seventh layer 36 is deposited on the top of layer 34. The seventh layer 36 preferably consists of fourth and fifth metals 36A and 36B each having a predetermined thickness. Metal layer 36A is preferably composed of Pt with a thickness of about 30 nm and metal layer 36B is preferably composed of gold (Au) with a thickness of about 150 nm. The sixth layer 36 preferably is defined on the periphery of the semi-transparent Schottky contact by electron beam evaporation and a lift off procedure known in the art.

Figure 13:
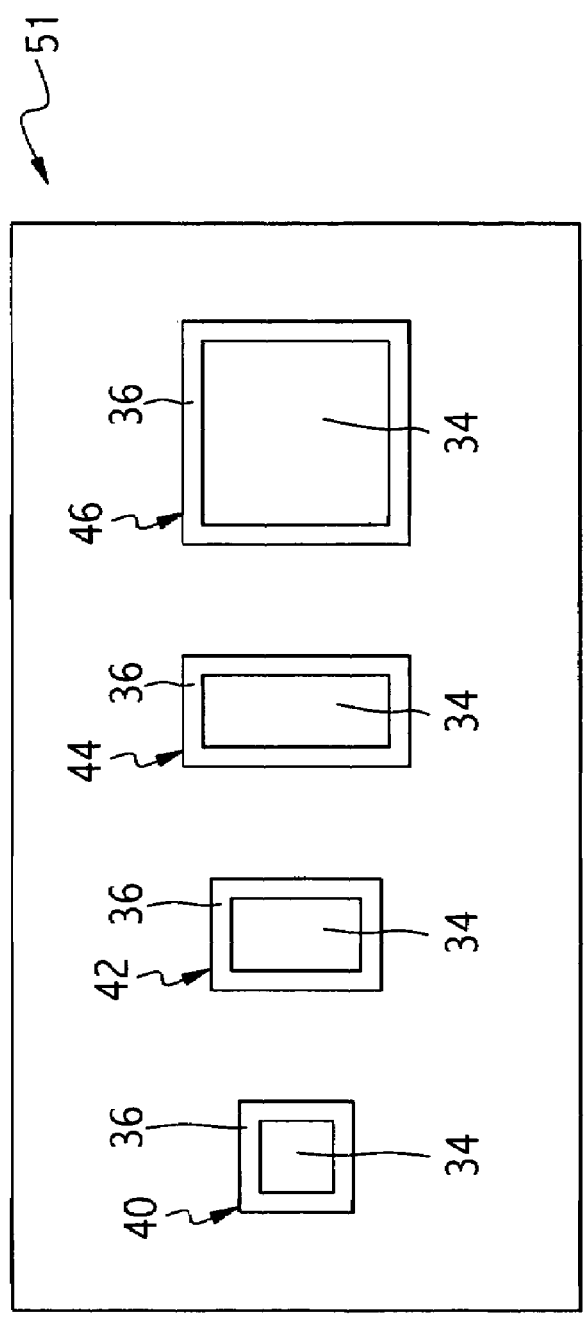
FIG. 13 is a top view of a product produced by the method of the present invention.

FIG. 13 shows a top view illustrating the finished device 51 made up of GaN Schottky barrier diodes 40, 42, 44, and 46, each comprised of layers 34 and 36, so as to form various active region sizes preferably ranging from about 0.25 $cm^2$ to about 1 $cm^2$.

It should now be appreciated that the practice of the present invention provides for a Pt/n⁻ Schottky barrier diode that serves as an extreme ultra-violet sensor (EUVS) having relatively large surface areas up to at least about 1 $cm^2$.

It should be further appreciated that the practice of the present invention provides a method for producing an EUVS that successfully operates at wavelengths less than about 200 nm, is radiation hardened, does not produce outgassing contamination, has relatively large surface areas, has low leakage current, successfully operates in the wavelength range of about 5 nm to about 125 nm, and has operational responses considered to be blind to visible or near infra-red radiation.

Although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

What is claimed is:

1. A method of forming a Schottky barrier diode comprising the steps of:
    a. depositing a first layer of a predetermined thickness on a top surface of a wafer;
    b. depositing a second layer on top of said first layer, said second layer serving as a buffer layer;
    c. depositing a third layer on top of said second layer, said third layer being composed of n⁺ epilayer;
    d. depositing a fourth layer on top of said third layer, said fourth layer being composed of a n⁻ epilayer;
    e. cleaning said wafer having said first, second, third and fourth layers thereon;
    f. masking said top surface of said fourth layer to cover and protect at least one area; and,
    g. etching said top surface of said fourth layer so as to produce one or more Schottky contact areas.

2. The method according to claim 1, wherein said buffer layer is of a predetermined thickness which is greater than said predetermined thickness of said first layer.

3. The method according to claim 1, said third layer having a predetermined thickness and a predetermined doping density.

4. The method according to claim 1, said fourth layer having a predetermined thickness and a predetermined doping density, and a top surface.

5. The method according to claim 1, wherein said wafer is comprised of a single crystal material.

6. The method according to claim 1, wherein said first layer is deposited via a nucleation process.

7. The method according to claim 1, wherein said third layer is deposited via a vapor phase epitaxy process.

8. The method according to claim 1, wherein four Schottky contact areas are formed.

9. The method according to claim 8, wherein said four contact areas range in size up to about 1 $cm^2$.

10. The method according to claim 1, wherein each Schottky contact areas includes a mesa having a top surface and a bottom portion of a surface.

11. The method according to claim 10, wherein said mesa includes at least one metal layer formed on at least one of said bottom portions.

12. The method according to claim 10, wherein said mesa is treated with an oxygen plasma process.

13. The method according to claim 10, wherein said mesa includes at least three metal layers formed on each of said bottom portions.

14. The method according to claim 10, wherein said mesa includes a semi-transparent layer formed on each of said surfaces.

15. The method according to claim 14, wherein said semi-transparent layer is formed of platinum.

16. The method according to claim 14, wherein a metal layer is formed on top of said semi-transparent layer.

17. The method according to claim 16 wherein said metal layer consist of two metal layers.

18. The method according to claim 17 wherein said two metal layers are composed of platinum and gold.

* * * * *